United States Patent
Chen et al.

(10) Patent No.: US 10,806,046 B2
(45) Date of Patent: Oct. 13, 2020

(54) PACKAGE STRUCTURE OF POWER MODULE

(71) Applicant: Delta Electronics, Inc., Taoyuan (TW)

(72) Inventors: Shao-Chuan Chen, Taoyuan (TW);
Hung-Yen Chan, Taoyuan (TW);
Chuan-Chia Cheng, Taoyuan (TW);
Hsueh-Kuo Liao, Taoyuan (TW);
Kai-Ti Chang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 16/659,879

(22) Filed: Oct. 22, 2019

(65) Prior Publication Data

US 2020/0267867 A1      Aug. 20, 2020

(30) Foreign Application Priority Data

Feb. 20, 2019   (CN) ........................ 2019 1 0126331

(51) Int. Cl.
| | | |
|---|---|---|
| H05K 7/00 | (2006.01) | |
| H05K 7/14 | (2006.01) | |
| H05K 5/00 | (2006.01) | |
| H05K 5/03 | (2006.01) | |
| H05K 7/20 | (2006.01) | |
| H05K 5/02 | (2006.01) | |

(52) U.S. Cl.
CPC ......... *H05K 7/1427* (2013.01); *H05K 5/0013* (2013.01); *H05K 5/0221* (2013.01); *H05K 5/03* (2013.01); *H05K 7/209* (2013.01)

(58) Field of Classification Search
CPC .................................................. G06F 3/0338
See application file for complete search history.

(56) References Cited

U.S. PATENT DOCUMENTS

| | | | |
|---|---|---|---|
| 2004/0135767 A1* | 7/2004 | Park ...................... | G06F 3/0338 |
| | | | 345/156 |
| 2016/0218454 A1* | 7/2016 | Chang .................. | H05K 7/1432 |

FOREIGN PATENT DOCUMENTS

| | | |
|---|---|---|
| TW | 201431268 A | 8/2014 |
| TW | 201628142 A | 8/2016 |
| TW | I550391 B | 9/2016 |
| TW | 201642404 A | 12/2016 |
| TW | 201715696 A | 5/2017 |

OTHER PUBLICATIONS

Office Action dated Mar. 24, 2020 issued in corresponding Taiwan Application No. 108105510.

* cited by examiner

*Primary Examiner* — Jerry Wu
(74) *Attorney, Agent, or Firm* — Muncy, Geissler, Olds & Lowe, P.C.

(57) ABSTRACT

A package structure of a power module is provided. The package structure includes a body having a sidewall, a first protruding structure protruding outward from one end of the sidewall, a second protruding structure protruding outward from another end of the sidewall and opposite to the first protruding structure, and a spring having two ends embedded in the first and the second protruding structures, respectively. The stress is transferred to the first and the second protruding structures via the spring, respectively. The equivalent stiffness of the spring is different from that of the body so that the package structure as a whole suffers the stress uniformly.

13 Claims, 6 Drawing Sheets

PACKAGE STRUCTURE OF POWER MODULE

CROSS REFERENCE TO RELATED APPLICATIONS

This application claims priority of China Patent No. 201910126331.2, filed on Feb. 20, 2019, the entirety of which is incorporated by reference herein.

BACKGROUND OF THE INVENTION

Field of the Invention

The invention relates to a package structure, and more particularly to a package structure of a power module with high stress transferring efficiency when latched.

Description of the Related Art

In the integrated power modules (IPMs) currently in use, excessive heat generated during operation needs to be dissipated by fixing the module to contact a heat sink. A heat-dissipating paste is further filled between the module and the heat sink to improve the heat dissipation efficiency.

When the elastic modulus of the material of the module is too large, or the process has a few tolerance, it is easy to generate excessive stress due to the amplification effect, which causing damage to the module itself or the built-in parts. On the contrary, when the elastic modulus of the material is too small, the module may easily be deformed, and the heat-dissipating paste cannot properly contact a region with larger deformation, which resulting in poor heat dissipation and reliability problems under environmental vibration and external impact.

Therefore, development of a package structure of a power module with high stress transferring efficiency when latched is desirable.

BRIEF SUMMARY OF THE INVENTION

In accordance with one embodiment of the invention, a package structure of a power module is provided. The package structure of the power module includes a body having a sidewall, a first protruding structure protruding outward from one end of the sidewall of the body, a second protruding structure protruding outward from another end of the sidewall of the body and opposite to the first protruding structure, and a spring having two ends respectively embedded in the first and second protruding structures. The stress is transferred to the first and second protruding structures via the spring respectively. The equivalent stiffness of the spring is different from that of the body so that the package structure as a whole suffers the stress uniformly.

In some embodiments, materials of the body, the first protruding structure and the second protruding structure include plastic. In some embodiments, the sidewall of the body has a thickness which is in a range from about 2 mm to about 5 mm. In some embodiments, the package structure of the power module further includes a substrate which is disposed on a bottom portion of the body. In some embodiments, material of the spring includes metal. In some embodiments, the spring has a thickness which is in a range from about 0.3 mm to about 0.8 mm. In some embodiments, the spring further includes a latch portion which is coordinated with an external latching component to fix the package structure. In some embodiments, the spring further includes at least a bending portion. In some embodiments, a part of the spring is bent toward the sidewall of the body to form the bending portion. In some embodiments, the bending portion partially overlaps the latch portion of the spring. In some embodiments, the spring further includes two openings which are arranged symmetrically on both sides of the latch portion. In some embodiments, the spring further includes a plurality of openings. In some embodiments, there is a gap between the spring and the sidewall of the body. In some embodiments, the sidewall of the body further includes a groove formed inwardly.

In the present invention, plastic is used as the material of the package structure of the power module, and the thickness of the body can be increased to improve its equivalent stiffness. In the latching area of the package structure, the metal spring is used to replace the common plastic latching component, and the thickness of the metal spring can be reduced to decrease its equivalent stiffness (e.g., the equivalent stiffness of the common plastic-made structure is about 18 times to the equivalent stiffness of the metal spring of the present invention). Different components (i.e. the body and the latching component) use different materials to create differences of equivalent stiffness so that the package structure of the present invention as a whole suffers the stress uniformly, the deformation thereof is reduced, and impact on each assembly component due to dimensional tolerances is effectively reduced. The openings with various shapes are created in the metal spring within the latching area, which can finely adjust the overall stress and force distribution between the body and the heat sink. A part of the metal spring is formed into a three-dimensional structure by bending, which can increase the rigidity and the second axial moment of area of the spring of the present invention as a whole, and is favorable for the transfer of stress. The size of related components is adjusted to improve the transferring of stress, immobility and supportability under vibration and impact. In addition, a groove is disposed between the latching area and the body such that the latching component located in the latching area as a fixed structure does not come into contact with the body, and the stress generated by the latching component is transferred toward lateral sides of the body, avoiding the generated stress directly transferring to the direct bonded copper (DBC) attached on the body to cause the stress to be too concentrated on the direct bonded copper (DBC). Therefore, the stress transfer area is increased and more uniform stress is obtained.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
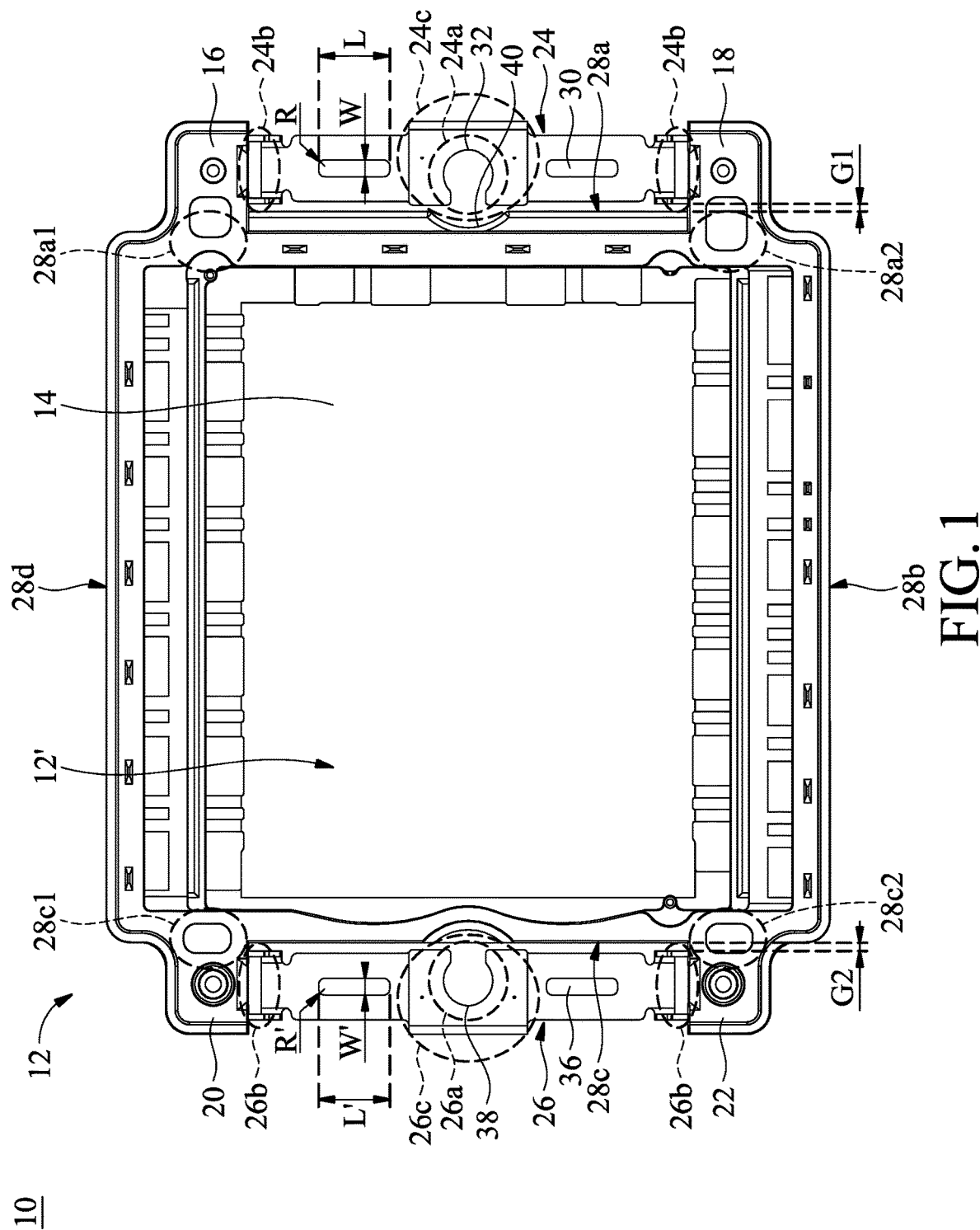
FIG. 1 is a top view of a package structure of a power module in accordance with one embodiment of the invention.
Figure 2:
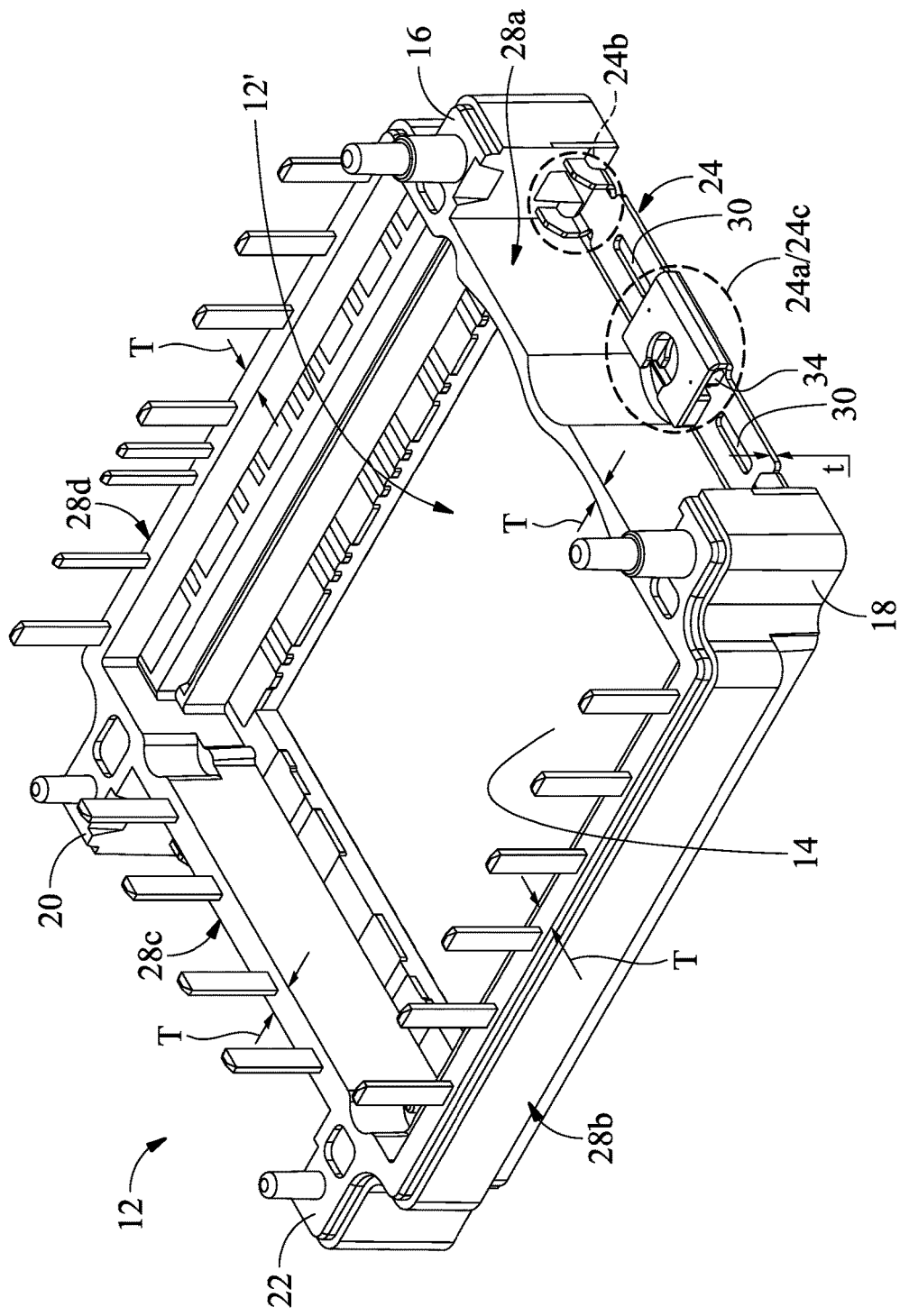
FIG. 2 is a stereoscopic view of a package structure of a power module in accordance with one embodiment of the invention.

Referring to FIGS. 1 and 2, in accordance with one embodiment of the invention, a package structure of a power module 10 is provided. FIG. 1 is a top view of the package structure of the power module 10. FIG. 2 is a stereoscopic view of the package structure of the power module 10.

As shown in FIGS. 1 and 2, the package structure of the power module 10 includes a body 12, a substrate 14, a first protruding structure 16, a second protruding structure 18, a third protruding structure 20, a fourth protruding structure 22, a first spring 24 and a second spring 26. The body 12 includes a first sidewall 28a, a second sidewall 28b, a third sidewall 28c and a fourth sidewall 28d. The first sidewall 28a, the second sidewall 28b, the third sidewall 28c and the fourth sidewall 28d are connected to each other to form main structure of the body 12, and an outer space and an inner space of the body 12 are substantially defined by the sidewalls. The first sidewall 28a is connected to the second sidewall 28b and the fourth sidewall 28d respectively. The third sidewall 28c is connected to the second sidewall 28b and the fourth sidewall 28d respectively. The first sidewall 28a is opposite to the third sidewall 28c. The second sidewall 28b is opposite to the fourth sidewall 28d. The substrate 14 is disposed on a bottom portion 12' of the body 12 and adjacent to the first sidewall 28a, the second sidewall 28b, the third sidewall 28c and the fourth sidewall 28d. The first protruding structure 16 protrudes outward from a first end 28a1 of the first sidewall 28a of the body 12. The second protruding structure 18 protrudes outward from a second end 28a2 of the first sidewall 28a of the body 12 and is opposite to the first protruding structure 16. The third protruding structure 20 protrudes outward from a first end 28c1 of the third sidewall 28c of the body 12. The fourth protruding structure 22 protrudes outward from a second end 28c2 of the third sidewall 28c of the body 12 and is opposite to the third protruding structure 20.

The first spring 24 includes a latch portion 24a. The first spring 24 is substantially a rectangular structure viewed in a projection plane, and both of its two ends 24b are respectively embedded in the first protruding structure 16 and the second protruding structure 18. In the present invention, the latch portion 24a of the first spring 24 is coordinated with an external latching component (not shown) to fix the package structure 10. The stress is transferred to the first protruding structure 16 and the second protruding structure 18 via the first spring 24, respectively. Specifically, in the design consideration of the present invention, the equivalent stiffness of the first spring 24 is different from the equivalent stiffness of the body 12. In addition, the second spring 26 includes a latch portion 26a. The second spring 26 is substantially a rectangular structure viewed in a projection plane, and both of its two ends 26b are respectively embedded in the third protruding structure 20 and the fourth protruding structure 22, respectively. In the present invention, the latch portion 26a of the second spring 26 is coordinated with an external latching component (not shown) to fix the package structure 10. The stress is transferred to the third protruding structure 20 and the fourth protruding structure 22 via the second spring 26, respectively. Specifically, in the design consideration of the present invention, the equivalent stiffness of the second spring 26 is different from the equivalent stiffness of the body 12. In some embodiments, the equivalent stiffness of the first spring 24 is the same as the equivalent stiffness of the second spring 26.

In some embodiments, the body 12, the first protruding structure 16, the second protruding structure 18, the third protruding structure 20 and the fourth protruding structure 22 may be made of or include various types of plastic materials, including but not limited to, for example, thermoplastic resin such as polyphenylene sulfide (PPS) or polyethylene terephthalate (PET). Other types of plastic materials may also be suitable for use in the present invention. In some embodiments, the thickness "T" of the first sidewall 28a, the second sidewall 28b, the third sidewall 28c and the fourth sidewall 28d of the body 12 is in a range from about 2 mm to about 5 mm.

In some embodiments, the substrate 14 may include various types of circuit boards for accommodating or interposing various electronic components, including but not limited to, for example, a printed circuit board (PCB). Other types of circuit boards may also be applied to the present invention.

In some embodiments, the first spring 24 may be made of or include various types of metal materials, including but not limited to, for example, stainless steel or manganese steel. Other types of metal materials may also be applied to the present invention. In some embodiments, Young's modulus of the first spring 24 is in a range from about 180 Mpa to about 220 Mpa. In some embodiments, the thickness "t" of the first spring 24 is in a range from about 0.3 mm to about 0.8 mm. In some embodiments, the equivalent stiffness of the first spring 24 is in a range from about 0.01 N/mm to about 0.08 N/mm. In some embodiments, the first spring 24 further includes a bending portion 24c. In some embodiments, the bending portion 24c partially overlaps the latch portion 24a of the first spring 24. In some embodiments, a part of the first spring 24 is bent inward (i.e. toward the first sidewall 28a of the body 12) to form the bending portion 24c. In some embodiments, depending on the demands on the final product, the first spring 24 may include a single or a plurality of bending portions 24c to form a double-layered structure or a multi-layered structure around the bending portions 24c, which improving structural strengthening effect. In some embodiments, the first spring 24 further includes a plurality of openings 30 which are formed and distributed therein. In some embodiments, the first spring 24 includes two openings 30 which have the same shape and are arranged symmetrically on both sides of the latch portion 24a, and which do not overlap the bending portions 24c, but the present invention is not limited thereto. In some embodiments, the openings 30 of the first spring 24 may include various shapes, including but not limited to, for example, a rounded rectangle, a circle, an ellipse or a polygon. Other shapes may also be suitable for the present invention. Here, a rounded-rectangle-shaped opening 30 is taken as an example for explanation. In some embodiments, the length "L" of longer side of the rounded-rectangle-shaped opening 30 is in a range from about 6 mm to about 8 mm. In some embodiments, the width "W" of shorter side of the rounded-rectangle-shaped opening 30 is in a range from about 1.2 mm to about 1.6 mm. In some embodiments, the radius "R" of the round corner of the rounded-rectangle-shaped opening 30 is in a range from about 0.5 mm to about 0.7 mm.

In some embodiments, the latch portion 24a of the first spring 24 is coordinated with an external latching component (not shown) which passes through a latch hole 32 to latch and fix the package structure 10. The latch hole 32 is located substantially in the central area of the latch portion 24a and partially opened at the edge of the latch portion 24a (i.e. a part of the latch hole 32 which is not surrounded by the latch portion 24a). In some embodiments, there may be various types of latching components, including but not limited to, for example, threaded screws, rivets or elastic parts. Other types of latching components may also be suitable for the present invention. In some embodiments, a metal sheet 34 is further inserted in the latch portion 24a, as shown in FIG. 2. In some embodiments, the metal sheet 34 may be made of or include various types of metal materials, including but not limited to, for example, stainless steel or manganese steel. Other types of metal materials may also be suitable for the present invention. In some embodiments, the material of the metal sheet 34 is the same as the material of the first spring 24. In some embodiments, two ends 24b of the first spring 24 are respectively embedded in the first protruding structure 16 and the second protruding structure 18 in an upwardly bending manner, as shown in FIG. 2.

In some embodiments, the second spring 26 may be made of or include various types of metal materials, including but not limited to, for example, stainless steel or manganese steel. Other types of metal materials may also be applied to the present invention. In some embodiments, Young's modulus of the second spring 26 is in a range from about 180 Mpa to about 220 Mpa. In some embodiments, the thickness of the second spring 26 is in a range from about 0.3 mm to about 0.8 mm, which is about the same as the thickness "t" of the first spring 24. In some embodiments, the equivalent stiffness of the second spring 26 is in a range from about 0.01 N/mm to about 0.08 N/mm. In some embodiments, the second spring 26 further includes a bending portion 26c. In some embodiments, the bending portion 26c partially overlaps the latch portion 26a of the second spring 26. In some embodiments, a part of the second spring 26 is bent inward (i.e. toward the third sidewall 28c of the body 12) to form the bending portion 26c. In some embodiments, depending on the demands on the final product, the second spring 26 may include a single or a plurality of bending portions 26c to form a double-layered structure or a multi-layered structure around the bending portions 26c, which improving structural strengthening effect. In some embodiments, the second spring 26 further includes a plurality of openings 36 which are formed and distributed therein. In some embodiments, the second spring 26 includes two openings 36 which have the same shape and are arranged symmetrically on both sides of the latch portion 26a, and which do not overlap the bending portions 26c, but the present invention is not limited thereto. In some embodiments, the openings 36 of the second spring 26 may include various shapes, including but not limited to, for example, a rounded rectangle, a circle, an ellipse or a polygon. Other shapes may also be suitable for the present invention. Here, a rounded-rectangle-shaped opening 36 is taken as an example for explanation. In some embodiments, the length L' of longer side of the rounded-rectangle-shaped opening 36 is in a range from about 6 mm to about 8 mm. In some embodiments, the width W' of shorter side of the rounded-rectangle-shaped opening 36 is in a range from about 1.2 mm to about 1.6 mm. In some embodiments, the radius R' of the round corner of the rounded-rectangle opening 36 is in a range from about 0.5 mm to about 0.7 mm.

In some embodiments, the latch portion 26a of the second spring 26 is coordinated with an external latching component (not shown) which passes through a latch hole 38 to latch and fix the package structure 10. The latch hole 38 is located substantially in the central area of the latch portion 26a and partially opened at the edge of the latch portion 26a (i.e. a part of the latch hole 38 is not surrounded by the latch portion 26a). In some embodiments, there may be various types of latching components, including but not limited to, for example, threaded screws, rivets or elastic parts. Other types of latching components may also be suitable for the present invention. In some embodiments, a metal sheet (not shown) is further inserted in the latch portion 26a by the manner of inserting the metal sheet 34 as shown in FIG. 2. In some embodiments, the metal sheet may be made of or include various types of metal materials, including but not limited to, for example, stainless steel or manganese steel. Other types of metal materials may also be suitable for the present invention. In some embodiments, the material of the metal sheet is the same as the material of the second spring 26. In some embodiments, two ends 26b of the second spring 26 are respectively embedded in the third protruding structure 20 and the fourth protruding structure 22 in an upwardly bending manner, which is similar to the manner that the two ends 24b of the first spring 24 are respectively embedded in the first protruding structure 16 and the second protruding structure 18 as shown in FIG. 2. In some embodiments, the openings 30 of the first spring 24 may have different shapes from those of the openings 36 of the second spring 26. For example, the opening 30 of the first spring 24 is a rounded rectangle, while the opening 36 of the second spring 26 is a circle, or the opening 30 of the first spring 24 is a circle, while the opening 36 of the second spring 26 is a rounded rectangle for example but not limited.

In some embodiments, the first sidewall 28a of the body 12 further includes a groove 40 formed inwardly which avoids that the part (for example, a too wide shaped screw head) of the latching component (not shown) passing through the latch portion 24a is in contact with the first sidewall 28a of the body 12 so as to damage the body 12. In addition, the recessed design and structure of the groove 40 can reduce the overall assembly volume of the package structure of the power module 10. In some embodiments, there is a gap "G1" between the first spring 24 and the first sidewall 28a of the body 12. That is, the first spring 24 is merely embedded in the first protruding structure 16 and the second protruding structure 18 via its two ends 24b thereof, and is not in contact with the first sidewall 28a of the body 12. In some embodiments, there is a gap "G2" between the second spring 26 and the third sidewall 28c of the body 12. That is, the second spring 26 is merely embedded in the third protruding structure 20 and the fourth protruding structure 22 via its two ends 26b thereof, and is not in contact with the third sidewall 28c of the body 12.

Figure 3:
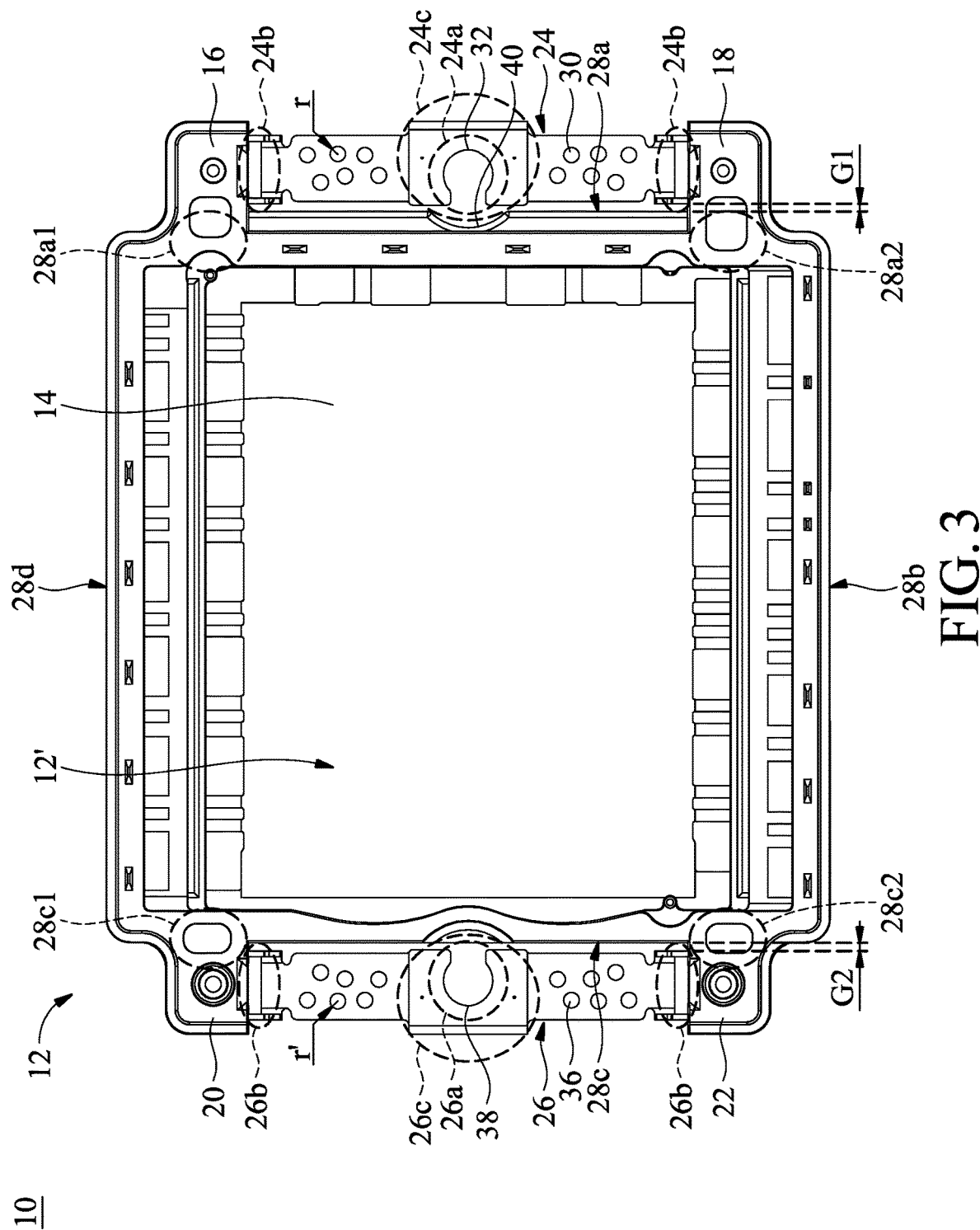
FIG. 3 is a top view of a package structure of a power module in accordance with one embodiment of the invention.
Figure 4:
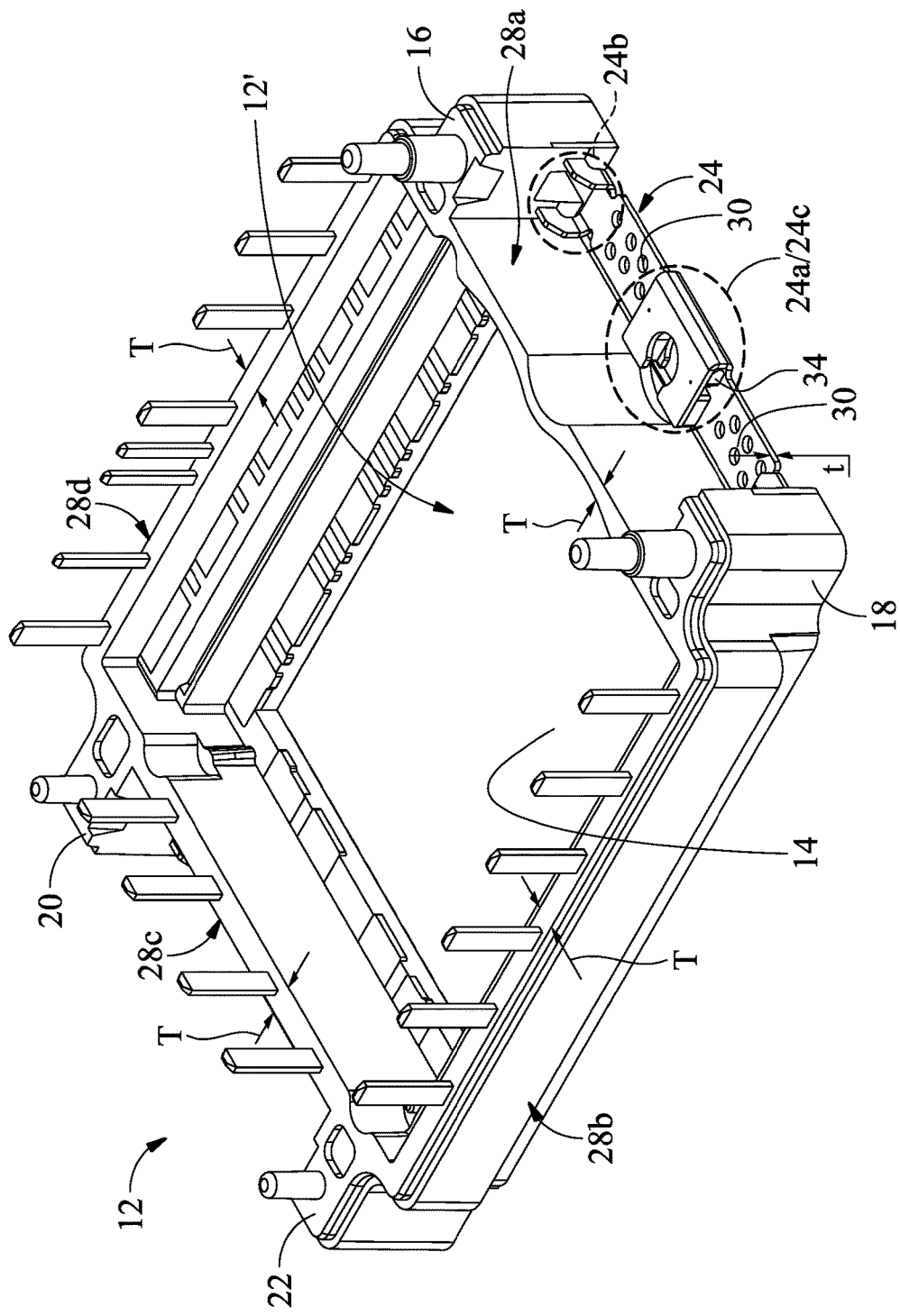
FIG. 4 is a stereoscopic view of a package structure of a power module in accordance with one embodiment of the invention.

Referring to FIGS. 3 and 4, in accordance with one embodiment of the invention, a package structure of a power module 10 is provided. FIG. 3 is a top view of the package structure of the power module 10. FIG. 4 is a stereoscopic view of the package structure of the power module 10.

As shown in FIGS. 3 and 4, the package structure of the power module 10 includes a body 12, a substrate 14, a first protruding structure 16, a second protruding structure 18, a third protruding structure 20, a fourth protruding structure 22, a first spring 24 and a second spring 26. The body 12 includes a first sidewall 28a, a second sidewall 28b, a third sidewall 28c and a fourth sidewall 28d. The first sidewall 28a, the second sidewall 28b, the third sidewall 28c and the fourth sidewall 28d are connected to each other to form main structure of the body 12, and an outer space and an inner space of the body 12 are substantially defined by the sidewalls. The first sidewall 28a is connected to the second sidewall 28b and the fourth sidewall 28d respectively. The third sidewall 28c is connected to the second sidewall 28b and the fourth sidewall 28d respectively. The first sidewall 28a is opposite to the third sidewall 28c. The second sidewall 28b is opposite to the fourth sidewall 28d. The substrate 14 is disposed on a bottom portion 12' of the body 12 and adjacent to the first sidewall 28a, the second sidewall 28b, the third sidewall 28c and the fourth sidewall 28d. The first protruding structure 16 protrudes outward from a first end 28a1 of the first sidewall 28a of the body 12. The second protruding structure 18 protrudes outward from a second end 28a2 of the first sidewall 28a of the body 12 and is opposite to the first protruding structure 16. The third protruding structure 20 protrudes outward from a first end 28c1 of the third sidewall 28c of the body 12. The fourth protruding structure 22 protrudes outward from a second end 28c2 of the third sidewall 28c of the body 12 and is opposite to the third protruding structure 20.

The first spring 24 includes a latch portion 24a. The first spring 24 is substantially a rectangular structure viewed in a projection plane, and both of its two ends 24b are respectively embedded in the first protruding structure 16 and the second protruding structure 18. In the present invention, the latch portion 24a of the first spring 24 is coordinated with an external latching component (not shown) to fix the package structure 10. The stress is transferred to the first protruding structure 16 and the second protruding structure 18 via the first spring 24, respectively. Specifically, in the design consideration of the present invention, the equivalent stiffness of the first spring 24 is different from the equivalent stiffness of the body 12. In addition, the second spring 26 includes a latch portion 26a. The second spring 26 is substantially a rectangular structure viewed in a projection plane, and both of its two ends 26b are respectively embedded in the third protruding structure 20 and the fourth protruding structure 22. In the present invention, the latch portion 26a of the second spring 26 is coordinated with an external latching component (not shown) to fix the package structure 10. The stress is transferred to the third protruding structure 20 and the fourth protruding structure 22 via the second spring 26, respectively. Specifically, in the design consideration of the present invention, the equivalent stiffness of the second spring 26 is different from the equivalent stiffness of the body 12. In some embodiments, the equivalent stiffness of the first spring 24 is the same as the equivalent stiffness of the second spring 26.

In some embodiments, the body 12, the first protruding structure 16, the second protruding structure 18, the third protruding structure 20 and the fourth protruding structure 22 may be made of or include various types of plastic materials, including but not limited to, for example, thermoplastic resin such as polyphenylene sulfide (PPS) or polyethylene terephthalate (PET). Other types of plastic materials may also be suitable for use in the present invention. In some embodiments, the thickness "T" of the first sidewall 28a, the second sidewall 28b, the third sidewall 28c and the fourth sidewall 28d of the body 12 is in a range from about 2 mm to about 5 mm.

In some embodiments, the substrate 14 may include various types of circuit boards for accommodating or interposing various electronic components, including but not limited to, for example, a printed circuit board (PCB). Other types of circuit boards may also be applied to the present invention.

In some embodiments, the first spring 24 may be made of or include various types of metal materials, including but not limited to, for example, stainless steel or manganese steel. Other types of metal materials may also be applied to the present invention. In some embodiments, Young's modulus of the first spring 24 is in a range from about 180 Mpa to about 220 Mpa. In some embodiments, the thickness "t" of the first spring 24 is in a range from about 0.3 mm to about 0.8 mm. In some embodiments, the equivalent stiffness of the first spring 24 is in a range from about 0.01 N/mm to about 0.08 N/mm. In some embodiments, the first spring 24 further includes a bending portion 24c. In some embodiments, the bending portion 24c partially overlaps the latch portion 24a of the first spring 24. In some embodiments, a part of the first spring 24 is bent inward (i.e. toward the first sidewall 28a of the body 12) to form the bending portion 24c. In some embodiments, depending on the demands on the final product, the first spring 24 may include a single or a plurality of bending portions 24c to form a double-layered structure or a multi-layered structure around the bending portions 24c, which improving structural strengthening effect.

In some embodiments, the first spring 24 further includes a plurality of openings 30 which are formed and distributed therein. In some embodiments, the openings 30 of the first spring 24 may include various shapes, including but not limited to, for example, a rounded rectangle, a circle, an ellipse or a polygon. Other shapes may also be suitable for the present invention. Here, a circular opening 30 is taken as an example for explanation. In some embodiments, the radius "r" of the circular opening 30 is in a range from about 1.0 mm to about 1.5 mm. In some embodiments, the number of the circular openings 30 is not limited, in order to meet the product requirements. In some embodiments, the latch portion 24a of the first spring 24 is coordinated with an external latching component (not shown) which passes through a latch hole 32 to latch and fix the package structure 10. The latch hole 32 is located substantially in the central area of the latch portion 24a and partially opened at the edge of the latch portion 24a (i.e. a part of the latch hole 32 is not surrounded by the latch portion 24a).

In some embodiments, there may be various types of latching components, including but not limited to, for example, threaded screws, rivets or elastic parts. Other types of latching components may also be suitable for the present invention. In some embodiments, in the first spring 24, the openings 30 located on both sides of the latch portion 24a have the same shape and are arranged symmetrically. In some embodiments, a metal sheet 34 is further inserted in the latch portion 24a, as shown in FIG. 4. In some embodiments, the metal sheet 34 may be made of or include various types of metal materials, including but not limited to, for example, stainless steel or manganese steel. Other types of metal materials may also be suitable for the present invention. In some embodiments, the material of the metal sheet 34 is the same as the material of the first spring 24. In some embodiments, two ends 24b of the first spring 24 are respectively embedded in the first protruding structure 16 and the second protruding structure 18 in an upwardly bending manner, as shown in FIG. 4.

In some embodiments, the second spring 26 may be made of or include various types of metal materials, including but not limited to, for example, stainless steel or manganese steel. Other types of metal materials may also be applied to the present invention. In some embodiments, Young's modulus of the second spring 26 is in a range from about 180 Mpa to about 220 Mpa. In some embodiments, the thickness of the second spring 26 is in a range from about 0.3 mm to about 0.8 mm, which is about the same as the thickness "t" of the first spring 24. In some embodiments, the equivalent stiffness of the second spring 26 is in a range from about 0.01 N/mm to about 0.08 N/mm. In some embodiments, the second spring 26 further includes a bending portion 26c. In some embodiments, the bending portion 26c partially overlaps the latch portion 26a of the second spring 26. In some embodiments, a part of the second spring 26 is bent inward (i.e. toward the third sidewall 28c of the body 12) to form the bending portion 26c. In some embodiments, depending on the demands on the final product, the second spring 26 may include a single or a plurality of bending portions 26c to form a double-layered structure or a multi-layered structure around the bending portions 26c, which improving structural strengthening effect.

In some embodiments, the second spring 26 further includes a plurality of openings 36 which are formed and distributed therein. In some embodiments, the openings 36 of the second spring 26 may include various shapes, including but not limited to, for example, a rounded rectangle, a circle, an ellipse or a polygon. Other shapes may also be suitable for the present invention. Here, a circular opening 36 is taken as an example for explanation. In some embodiments, the radius r' of the circular opening 36 is in a range from about 1.0 mm to about 1.5 mm. In some embodiments, the number of the circular openings 36 is not limited, in order to meet the product requirements. In some embodiments, the latch portion 26a of the second spring 26 is coordinated with an external latching component (not shown) which passes through a latch hole 38 to latch and fix the package structure 10. The latch hole 38 is located substantially in the central area of the latch portion 26a and partially opened at the edge of the latch portion 26a (i.e. a part of the latch hole 38 is not surrounded by the latch portion 26a).

In some embodiments, there may be various types of latching components, including but not limited to, for example, threaded screws, rivets or elastic parts. Other types of latching components may also be suitable for the present invention. In some embodiments, in the second spring 26, the openings 36 located on both sides of the latch portion 26a have the same shape and are arranged symmetrically. In some embodiments, a metal sheet (not shown) is further inserted in the latch portion 26a by the manner of inserting the metal sheet 34 as shown in FIG. 4. In some embodiments, the metal sheet may be made of or include various types of metal materials, including but not limited to, for example, stainless steel or manganese steel. Other types of metal materials may also be suitable for the present invention. In some embodiments, the material of the metal sheet is the same as the material of the second spring 26. In some embodiments, the two ends 26b of the second spring 26 are respectively embedded in the third protruding structure 20 and the fourth protruding structure 22 in an upwardly bending manner, which is similar to the manner that the two ends 24b of the first spring 24 are respectively embedded in the first protruding structure 16 and the second protruding structure 18 as shown in FIG. 4. In some embodiments, the openings 30 of the first spring 24 may have different shapes from those of the openings 36 of the second spring 26. For example, the opening 30 of the first spring 24 is a circle, while the opening 36 of the second spring 26 is a rounded rectangle, or the opening 30 of the first spring 24 is a rounded rectangle, while the opening 36 of the second spring 26 is a circle for example but not limited.

In some embodiments, the first sidewall 28a of the body 12 further includes a groove 40 formed inwardly which avoids that the part (for example, a too wide shaped screw head) of the latching component (not shown) passing through the latch portion 24a is in contact with the first sidewall 28a of the body 12 so as to damage the body 12. In addition, the recessed design and structure of the groove 40 can reduce the overall assembly volume of the package structure of the power module 10. In some embodiments, there is a gap "G1" between the first spring 24 and the first sidewall 28a of the body 12. That is, the first spring 24 is merely embedded in the first protruding structure 16 and the second protruding structure 18 via its two ends 24b, and is not in contact with the first sidewall 28a of the body 12. In some embodiments, there is a gap "G2" between the second spring 26 and the third sidewall 28c of the body 12. That is, the second spring 26 is merely embedded in the third protruding structure 20 and the fourth protruding structure 22 via its two ends 26b, and is not in contact with the third sidewall 28c of the body 12.

Figure 5:
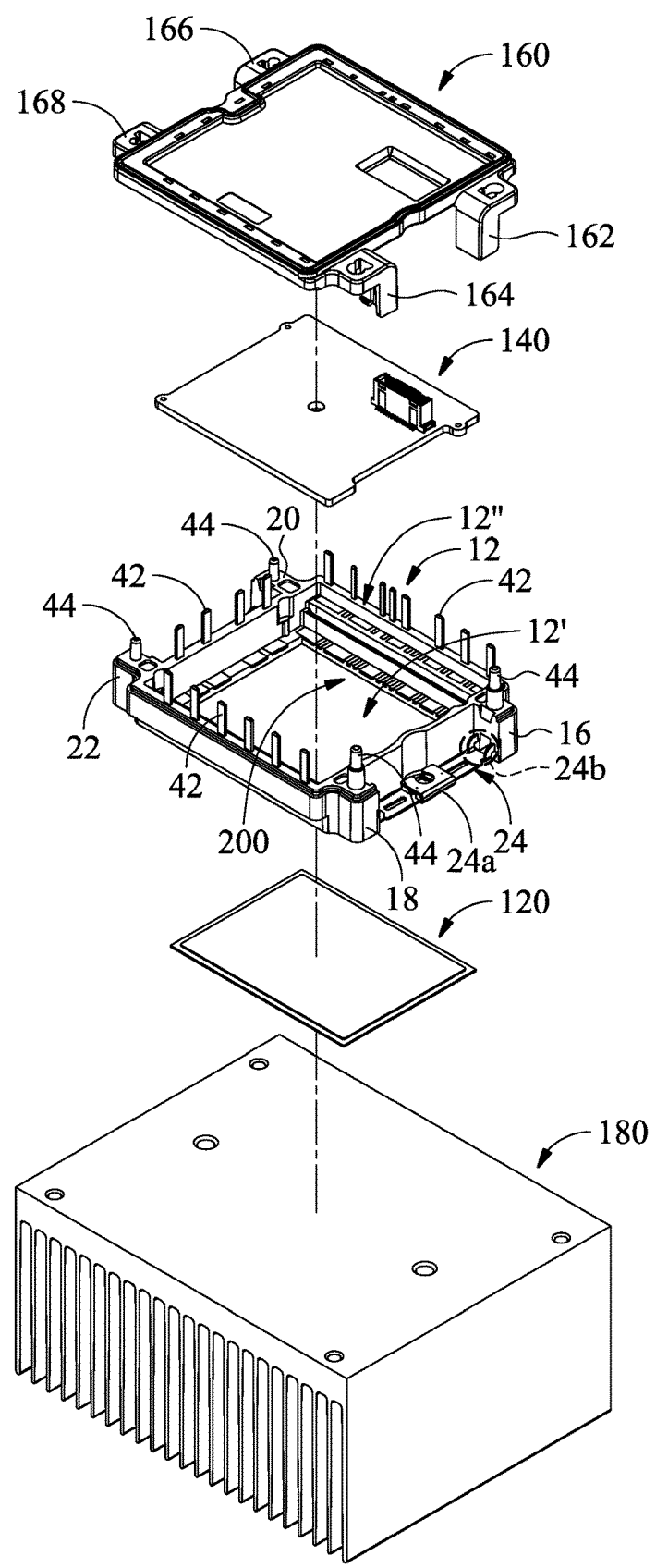
FIG. 5 is an exploded view of a package structure of a power module in accordance with one embodiment of the invention.
Figure 6:
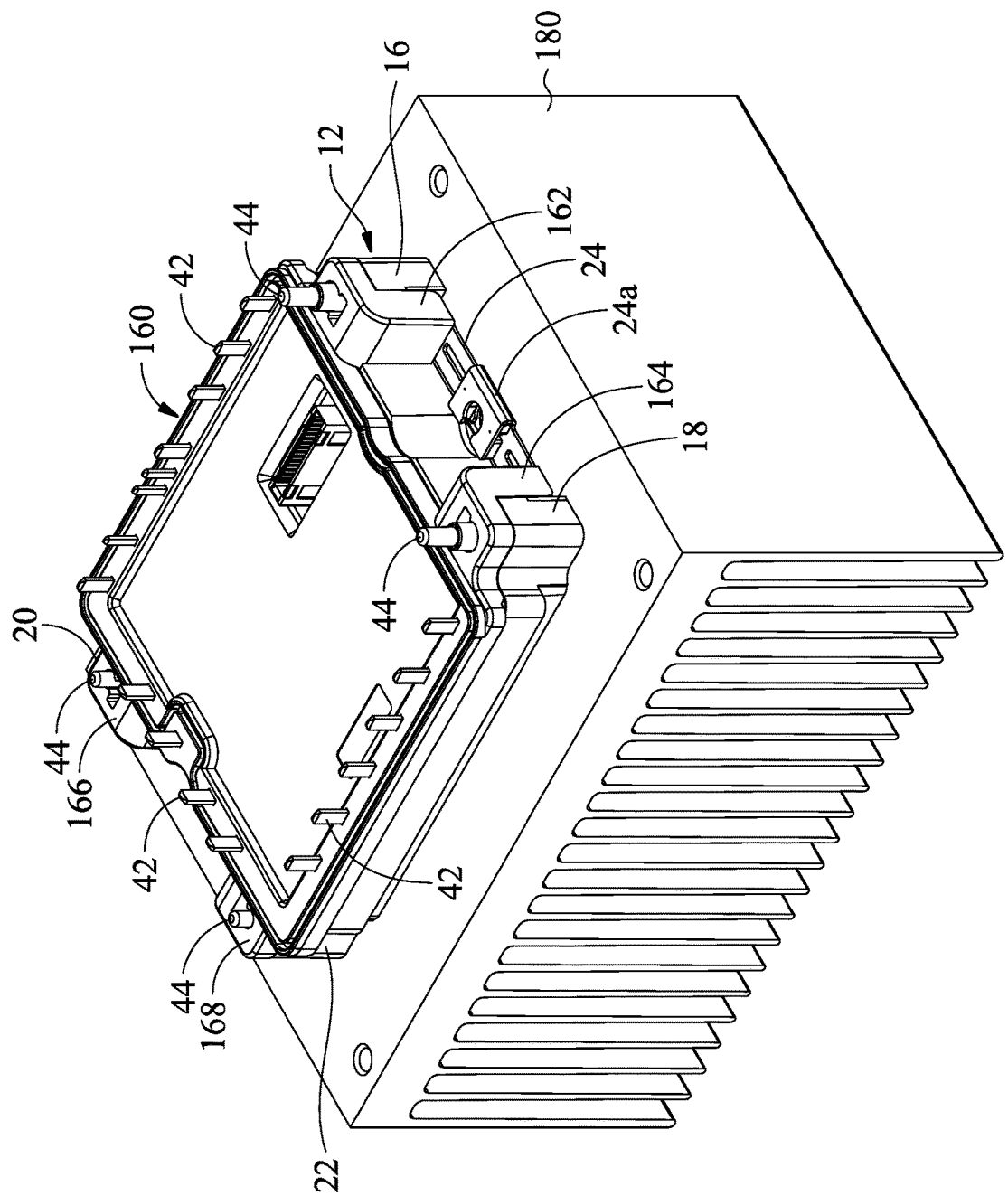
FIG. 6 is a combination view of a package structure of a power module in accordance with one embodiment of the invention.

Referring to FIGS. 5 and 6, in accordance with one embodiment of the invention, a package structure of an integrated power module (IPM) 100 is provided. FIG. 5 is an exploded view of the package structure of the IPM 100. FIG. 6 is a combination view of the package structure of the IPM 100.

As shown in FIGS. 5 and 6, the package structure of the integrated power module (IPM) 100 includes the body 12, the first spring 24 embedded in the first protruding structure 16 and the second protruding structure 18, the second spring (not shown) embedded in the third protruding structure 20 and the fourth protruding structure 22 of FIG. 2, a first substrate 120, a second substrate 140, an upper cover 160 and a heat sink 180. The first substrate 120 is disposed on the bottom portion 12' of the body 12. The upper cover 160 is disposed on an upper portion 12" of the body 12, and some components, for example, the latches 42 and the posts 44, of the body 12 are exposed from the upper cover 160. The body 12, the first substrate 120 and the upper cover 160 substantially constitute an accommodation space 200 thereof. The second substrate 140 is disposed on the body 12 and located in the accommodation space 200. The upper cover 160 includes a first coupling portion 162, a second coupling portion 164, a third coupling portion 166 and a fourth coupling portion 168 which respectively correspond to the first protruding structure 16, the second protruding structure 18, the third protruding structure 20 and the fourth protruding structure 22 protruding outward from the body 12. When the upper cover 160 is disposed on the upper portion 12" of the body 12, the first coupling portion 162, the second coupling portion 164, the third coupling portion 166 and the fourth coupling portion 168 respectively cover the two ends 24b of the first spring 24 and the two ends 26b of the second spring 26. The body 12 is fixed on the heat sink 180 via an additional external latching component (not shown) which passes through at least one of the latch portion 24a of the first spring 24 and the latch portion 26a of the second spring 26.

In some embodiments, the first substrate 120 and the second substrate 140 may be made of or include various types of circuit boards for accommodating or interposing various electronic components, including but not limited to, for example, a printed circuit board (PCB). Other types of circuit boards may also be applied to the present invention.

In the present invention, plastic is used as the material of the package structure of the power module, and the thickness of the body can be increased to improve its equivalent stiffness. In the latching area of the package structure, the metal spring is used to replace the common plastic latching component, and the thickness of the metal spring can be reduced to decrease its equivalent stiffness (e.g., the equivalent stiffness of the common plastic-made structure is about 18 times to the equivalent stiffness of the metal spring of the present invention). Different components (i.e. the body and the latching component) use different materials to create differences of equivalent stiffness so that the package structure of the present invention as a whole suffers the stress uniformly, the deformation thereof is reduced, and impact on each assembly component due to dimensional tolerances is effectively reduced. The openings with various shapes are created in the metal spring within the latching area, which can finely adjust the overall stress and force distribution between the body and the heat sink. A part of the metal spring is formed into a three-dimensional structure by bending, which can increase the rigidity and the second axial moment of area of the spring of the present invention as a whole, and is favorable for the transfer of stress. The size of related components is adjusted to improve the transferring of stress, immobility and supportability under vibration and impact. In addition, a groove is disposed between the latching area and the body such that the latching component located in the latching area as a fixed structure does not come into contact with the body, and the stress generated by the latching component is transferred toward lateral sides of the body, avoiding the generated stress directly transferring to the direct bonded copper (DBC) attached on the body to cause the stress to be too concentrated on the direct bonded copper (DBC). Therefore, the stress transfer area is increased and more uniform stress is obtained.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure of a power module, comprising: a body having a sidewall; a first protruding structure protruding outward from one end of the sidewall of the body; a second protruding structure protruding outward from another end of the sidewall of the body and opposite to the first protruding structure; and a spring having two ends respectively embedded in the first protruding structure and the second protruding structure, wherein stress is transferred to the first protruding structure and the second protruding structure via the spring respectively, and equivalent stiffness of the spring is different from that of the body so that the package structure as a whole suffers the stress uniformly; and the spring further comprises a latch portion which is coordinated with an external latching component to fix the package structure through a latch hole.

2. The package structure of the power module as claimed in claim 1, wherein materials of the body, the first protruding structure and the second protruding structure comprise plastic.

3. The package structure of the power module as claimed in claim 1, wherein the sidewall of the body has a thickness which is in a range from 2 mm to 5 mm.

4. The package structure of the power module as claimed in claim 1, further comprising a substrate disposed on a bottom portion of the body.

5. The package structure of the power module as claimed in claim 1, wherein material of the spring comprises metal.

6. The package structure of the power module as claimed in claim 5, wherein the spring has a thickness which is in a range from 0.3 mm to 0.8 mm.

7. The package structure of the power module as claimed in claim 1, wherein the spring further comprises at least a bending portion.

8. The package structure of the power module as claimed in claim 7, wherein a part of the spring is bent toward the sidewall of the body to form the bending portion.

9. The package structure of the power module as claimed in claim 7, wherein the bending portion partially overlaps the latch portion of the spring.

10. The package structure of the power module as claimed in claim 7, wherein the spring further comprises two openings which are arranged symmetrically on both sides of the latch portion.

11. The package structure of the power module as claimed in claim 1, wherein the spring further comprises a plurality of openings.

12. The package structure of the power module as claimed in claim 1, wherein there is a gap between the spring and the sidewall of the body.

13. The package structure of the power module as claimed in claim 1, wherein the sidewall of the body further comprises a groove formed inwardly.

* * * * *